(12) United States Patent
Son et al.

(10) Patent No.: US 11,171,259 B2
(45) Date of Patent: Nov. 9, 2021

(54) ELECTRODE SUBSTRATE FOR TRANSPARENT LIGHT-EMITTING DIODE DISPLAY AND METHOD FOR MANUFACTURING SAME

(71) Applicant: LG CHEM, LTD., Seoul (KR)

(72) Inventors: Yong Goo Son, Daejeon (KR); Jooyeon Kim, Daejeon (KR); Kun Seok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/619,034

(22) PCT Filed: Sep. 14, 2018

(86) PCT No.: PCT/KR2018/010833
§ 371 (c)(1),
(2) Date: Dec. 3, 2019

(87) PCT Pub. No.: WO2019/066336
PCT Pub. Date: Apr. 4, 2019

(65) Prior Publication Data
US 2020/0144455 A1    May 7, 2020

(30) Foreign Application Priority Data
Sep. 26, 2017    (KR) .................. 10-2017-0124199

(51) Int. Cl.
*H01L 33/38*    (2010.01)
*H01L 25/075*   (2006.01)
*H01L 33/00*    (2010.01)
*H01L 33/42*    (2010.01)

(52) U.S. Cl.
CPC ........ *H01L 33/387* (2013.01); *H01L 25/0753* (2013.01); *H01L 33/0095* (2013.01); *H01L 33/42* (2013.01); *H01L 2933/0016* (2013.01)

(58) Field of Classification Search
None
See application file for complete search history.

(56) References Cited

U.S. PATENT DOCUMENTS

| | | |
|---|---|---|
| 6,097,351 A | 8/2000 | Nishida |
| 10,854,582 B2 | 12/2020 | Maki |
| 2001/0038127 A1 | 11/2001 | Yamazaki et al. |

(Continued)

FOREIGN PATENT DOCUMENTS

| | | |
|---|---|---|
| EP | 1850649 A1 | 10/2007 |
| JP | 2934662 | 8/1999 |
| JP | 2001-330860 | 11/2001 |
| JP | 2009-198853 | 9/2009 |
| JP | 2 011-243448 | 12/2011 |
| JP | 2015-082178 | 4/2015 |

(Continued)

*Primary Examiner* — Long Pham
(74) *Attorney, Agent, or Firm* — Dentons US LLP

(57) ABSTRACT

An electrode substrate for a transparent light emitting device display containing a transparent substrate; a wire electrode unit, which is provided on the transparent substrate and comprises a metal mesh pattern; and at least one light emitting device mounting unit provided on the transparent substrate, in which both an upper surface and a lateral surface of the metal mesh pattern of the wire electrode unit comprise a darkening layer pattern, and both an upper surface and a lateral surface of the light emitting device mounting unit do not comprise a darkening layer pattern.

13 Claims, 8 Drawing Sheets

(56) References Cited

U.S. PATENT DOCUMENTS

| | | | |
|---|---|---|---|
| 2009/0042150 A1* | 2/2009 | Yamada | H05K 9/0096 |
| | | | 430/432 |
| 2011/0003086 A1 | 1/2011 | Chung et al. | |
| 2014/0320438 A1 | 10/2014 | Yurlov et al. | |
| 2016/0245491 A1* | 8/2016 | Kim | H05K 1/0274 |
| 2016/0291709 A1 | 10/2016 | Hwang et al. | |
| 2017/0102808 A1 | 4/2017 | Goto et al. | |
| 2018/0049318 A1 | 2/2018 | Maki | |
| 2018/0149920 A1* | 5/2018 | Yamazaki | G06F 3/0443 |
| 2018/0151597 A1* | 5/2018 | Yamazaki | G06F 3/0412 |
| 2019/0265532 A1* | 8/2019 | Yamazaki | G02F 1/13338 |
| 2020/0144455 A1* | 5/2020 | Son | H01L 33/38 |
| 2020/0241702 A1* | 7/2020 | Omote | G06F 3/0445 |
| 2021/0117043 A1* | 4/2021 | Lee | G06F 3/0412 |

FOREIGN PATENT DOCUMENTS

| | | |
|---|---|---|
| JP | 2015-125605 | 7/2015 |
| JP | 2016071533 | 5/2016 |
| KR | 10-20070122552 | 12/2007 |
| KR | 10-20090061225 | 6/2009 |
| KR | 10-1105887 | 1/2012 |
| KR | 10-20140070489 | 6/2014 |
| KR | 10-1422270 | 7/2014 |
| KR | 10-1482401 | 1/2015 |
| KR | 10-20160103818 | 9/2016 |
| KR | 10-1689131 | 12/2016 |
| KR | 10-2017-0021417 | 2/2017 |
| KR | 10-20170079616 | 7/2017 |
| WO | 2016-178322 | 11/2016 |
| WO | 2017-115712 | 7/2017 |

* cited by examiner

[Figure 1]
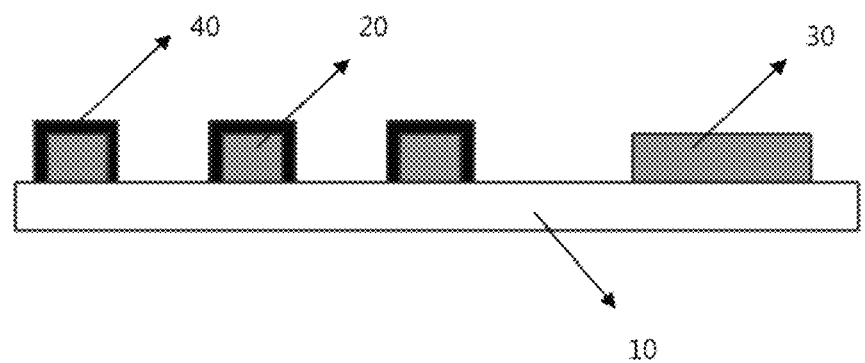

[Figure 6]
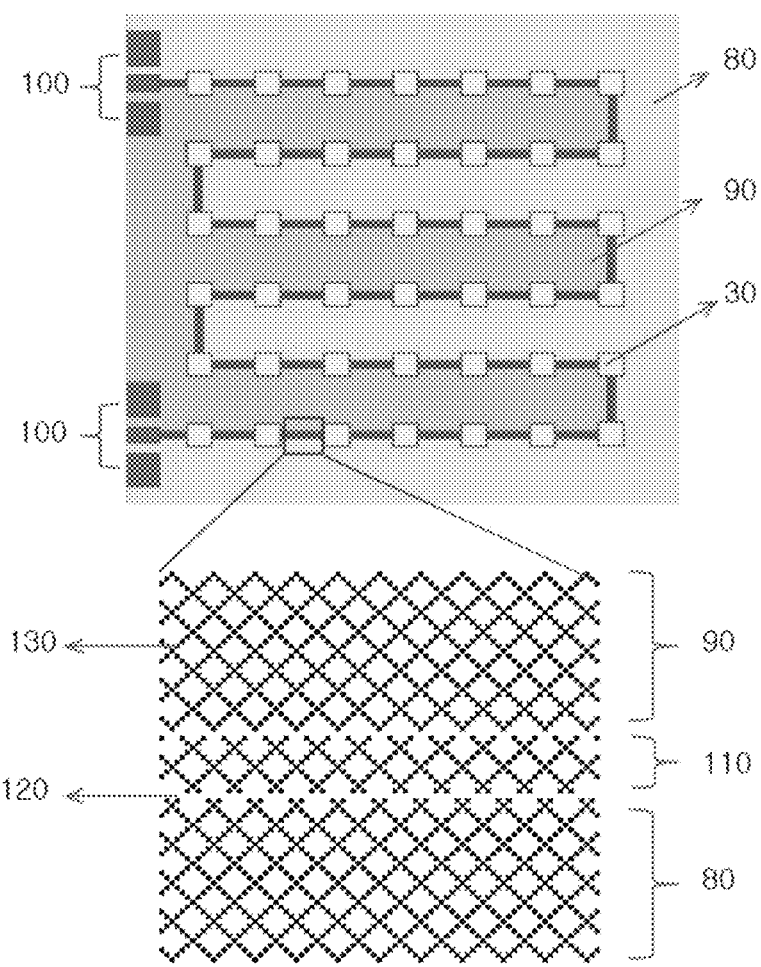
[Figure 7]
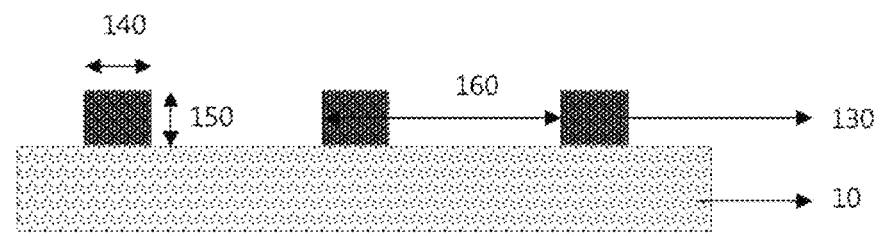

⟨Solder Shape After Heat Treatment⟩

⟨After Attachment Evaluation⟩

⟨Solder Shape After Heat Treatment⟩

⟨After Attachment Evaluation⟩

ELECTRODE SUBSTRATE FOR TRANSPARENT LIGHT-EMITTING DIODE DISPLAY AND METHOD FOR MANUFACTURING SAME

CROSS-REFERENCE TO RELATED APPLICATIONS

This application is a National Stage Application of International Application No. PCT/KR2018/010833 filed on Sep. 14, 2018, which claims priority to and the benefit of Korean Patent Application No. 10-2017-0124199 filed in the Korean Intellectual Property Office on Sep. 26, 2017, the entire contents of which are incorporated herein by reference.

TECHNICAL FIELD

The present application relates to an electrode substrate for a transparent light emitting device display and a method of manufacturing the same.

BACKGROUND

Recently, Korea creates various exterior lighting in parks and town centers, as well as colorful signs, and provides information and attraction to urban residents through the convergence of high-tech information and communication technology (ICT) and light emitting diode (LED) technology. Particularly, an indium tin oxide (ITO) transparent LED display using a transparent electrode material adopts an LED between glass, and has an advantage in that wires are not viewed, so that it is possible to display light with high quality. Accordingly, the transparent LED display is utilized in the interior of a hotel, a department store and the like, and has increasing importance in implementing media façade of an exterior wall of a building.

According to a spread of a smart device, demands of a transparent electrode, which is transparent, is electrically conducted, and is used in a touch screen and the like, are explosive, and the most widely used transparent electrode among the transparent electrodes is an indium tin oxide (ITO) that is an oxide of indium and tin. However, reserves of indium, which is a main raw material of the material of the ITO transparent electrode, are not largely available globally and indium is produced only in some countries, such as China, and production cost of indium is high. Further, indium has a disadvantage in that a resistance value of indium applied is not uniform, so that an expressed light beam of an LED is not uniform. Accordingly, the transparent LED utilizing ITO has a limit in being utilized as a transparent electrode material with high performance and low cost.

It is a fact that the ITO has been most dominantly used as a transparent electrode material, but research and technology development utilizing a new material are continuously conducted due to a limit in economic feasibility, restricted performance, and the like. As a transparent electrode material attracting attention as a next-generation new material, there are metal mesh, an Ag nanowire, carbon nano tube (CNT), conductive polymer, graphene, and the like. Among them, the metal mesh is a new material, which occupies 85% of a material replacing the ITO, is low cost and has high conductivity, so that a market of the metal mesh is expanded in an aspect of utilization of the metal mesh.

The transparent LED display utilizing the metal mesh is easily repaired and maintained, is capable of saving resources, is capable of considerably preventing environmental contamination, and is economical by a decrease in manufacturing cost, compared to an existing ITO transparent display. Further, the transparent LED display utilizing the metal mesh can be expansively applied for various purposes and can be applied to and utilized in various products as a new transparent electrode material.

Technical Problem

The present application aims to provide an electrode substrate for a transparent light emitting device display and a method of manufacturing the same.

Technical Solution

An exemplary embodiment of the present application provides an electrode substrate for a transparent light emitting device display, comprising: a transparent substrate; a wire electrode unit, which is provided on the transparent substrate and comprises a metal mesh pattern; and at least one light emitting device mounting unit provided on the transparent substrate, in which both an upper surface and a lateral surface of the metal mesh pattern of the wire electrode unit comprise a darkening layer pattern, and both an upper surface and a lateral surface of the light emitting device mounting unit do not comprise a darkening layer pattern.

Another exemplary embodiment of the present application provides a method of manufacturing an electrode substrate for a transparent light emitting device display, the method comprising: preparing an electrode substrate comprising a transparent substrate, a wire electrode unit, which is provided on the transparent substrate and comprises a metal mesh pattern, and at least one light emitting device mounting unit provided on the transparent substrate; forming a resist pattern on both an upper surface and a lateral surface of at least one light emitting device mounting unit; forming a darkening layer pattern on both an upper surface and a lateral surface of the metal mesh pattern of the wire electrode unit; and removing the resist pattern.

Advantageous Effects

According to the exemplary embodiment of the present application, the darkening layer pattern is provided on both the upper surface and the lateral surface of the metal mesh pattern of the wire electrode unit, so that there is a characteristic in that it is possible to decrease visibility of the electrode substrate for the transparent light emitting device display.

Further, the darkening layer pattern is provided on only both the upper surface and the lateral surface of the metal mesh pattern of the wire electrode unit, but is not provided on the upper surface and the lateral surface of the light emitting device mounting unit, so that there is an effect in that attachment force of the solder provided on the light emitting device mounting unit is maintained during the manufacturing of the transparent light emitting device display.

Further, according to the exemplary embodiment of the present application, the metal mesh pattern having the same line width, line height, and pitch is applied to the first common electrode wiring unit, the second common electrode wiring unit, and the signal electrode wiring unit, thereby decreasing visibility of the wire. Further, the metal mesh pattern of the wire electrode unit is provided in the entire region of the effective screen unit of the upper surface of the transparent substrate, except for the light emitting device mounting unit pattern, so that it is possible to maximize an extent of the common electrode wiring unit and reduce resistance.

DESCRIPTION OF DRAWINGS

FIG. 1 is a diagram schematically illustrating an electrode substrate for a transparent light emitting device display according to an exemplary embodiment of the present application.

FIG. 6 is a diagram schematically illustrating a wire electrode unit and a light emitting device mounting unit of the transparent light emitting device display according to an exemplary embodiment of the present application.

FIG. 7 is a diagram schematically illustrating a line width, a line height, and pitch of a metal mesh pattern according to an exemplary embodiment of the present application.

EXPLANATION OF REFERENCE NUMERALS AND SYMBOLS

Figure 2A:
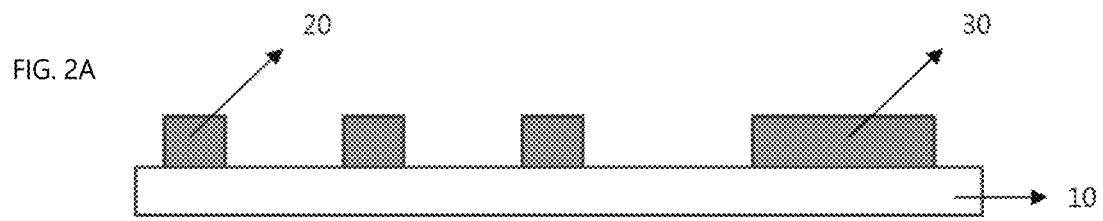
FIGS. 2A-2D are diagrams schematically illustrating a method of manufacturing an electrode substrate for a transparent light emitting device display according to an exemplary embodiment of the present application.
Figure 2B:
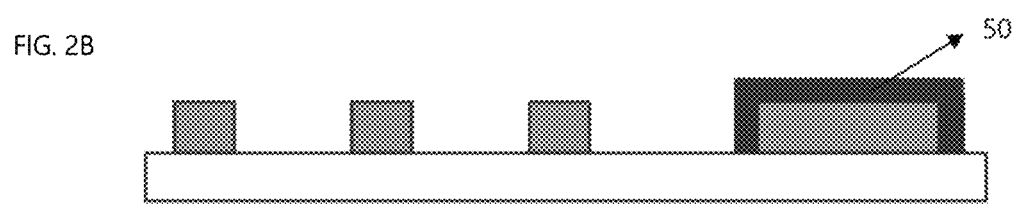
Figure 2C:
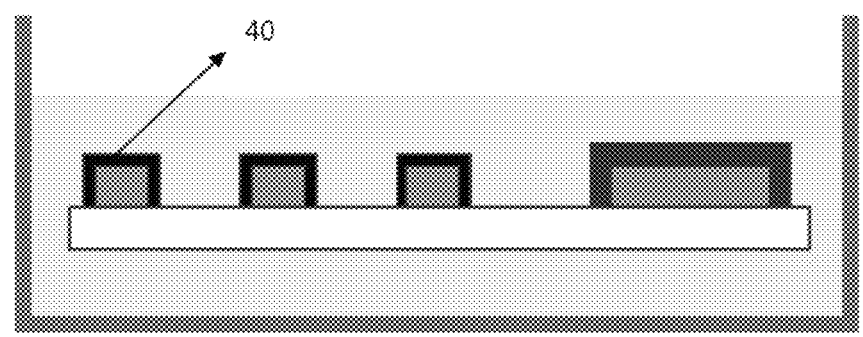
Figure 2D:
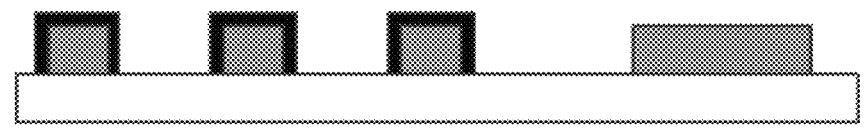

10: transparent substrate
20: wire electrode unit
30: light emitting device mounting unit
40: darkening layer pattern
50: resist pattern
60: light emitting device
70: solder
80: first common electrode wiring portion
90: second common electrode wiring portion
100: power supply unit
110: signal electrode wiring portion
120: disconnection portion
130: metal mesh pattern
140: line width of metal mesh pattern
150: line height of metal mesh pattern
160: pitch of metal mesh pattern

BEST MODE FOR CARRYING OUT THE INVENTION

Hereinafter, the present application will be described in detail.

In the present application, "transparent" is defined to have to a transmittance characteristic of about 80% or more in a visible ray region (400 nm to 700 nm).

A transparent light emitting diode (LED) display provides various attraction for urban residents through an information providing service and producing spectacle, and demands thereof are increasing in various fields. It is a fact that an indium tin oxide (ITO) has been most dominantly used as a transparent electrode material until now, but research and technology development utilizing a new material are continuously conducted due to a limit in economic feasibility, restricted performance, and the like.

More particularly, in implementing a transparent LED display in the related art, transparent electrode wiring is formed by adopting an Ag nanowire or a transparent metal oxide (ITO, indium zinc oxide (IZO), and the like). However, the Ag nanowire or the transparent metal oxide (ITO, IZO, and the like) has high resistance, but there is a limit in manufacturing a transparent LED display to have a large area due to a limit in the number of LEDs driven. Further, when a thickness of the Ag nanowire or the transparent metal oxide is increased in order to reduce resistance, there is a problem in that transmittance of the transparent LED display deteriorates.

In this respect, in the present application, in order to provide a transparent light emitting device display having excellent resistance characteristic, visibility, and the like, a metal electrode is applied to an electrode substrate for a transparent light emitting device display. When the metal electrode is applied, there is an advantage in that it is possible to secure low resistance, but there is a problem in that external visibility is increased due to an increase in reflectance and a yellow index (YI). When a darkening layer is formed on a surface of the metal electrode in order to suppress the phenomenon, there can be a problem in that force for attaching solder to a light emitting diode (LED) mounting unit is decreased.

Accordingly, the present application aims to provide a transparent light emitting device display, which has excellent resistance characteristic, visibility, and the like, and in which solder attachment force in an LED mounting unit is maintainable.

An electrode substrate for a transparent light emitting device display according to an exemplary embodiment of the present application comprises: a transparent substrate; a wire electrode unit, which is provided on the transparent substrate and comprises a metal mesh pattern; and at least one light emitting device mounting unit provided on the transparent substrate, in which both an upper surface and a lateral surface of the metal mesh pattern of the wire electrode unit comprise a darkening layer pattern.

In the present application, the transparent substrate can be a glass substrate or a transparent plastic substrate having excellent transparency, surface smoothness, treatment easiness, and waterproofing property, but is not limited thereto, and as long as a transparent substrate is generally used in an electronic device, the transparent substrate is not limited. Particularly, the transparent substrate can be a substrate formed of glass, a urethane resin, a polyimide resin, a polyester resin, a (meth)acrylate-based polymer resin; a polyolefin-based resin, such as polyethylene or polypropylene, and the like.

In the present application, the wire electrode unit can comprise a first common electrode wiring unit, a second common electrode wiring unit, and a signal electrode wiring unit. Further, the first common electrode wiring unit, the second common electrode wiring unit, and the signal electrode wiring unit comprise the metal mesh patterns having the same line width, line height, and pitch, and the metal mesh pattern can be provided in an entire region of an effective screen unit on the transparent substrate, except for the light emitting device mounting unit.

The signal electrode wiring unit can be provided between the first common electrode wiring unit and the second common electrode wiring unit.

In the present application, the first common electrode wiring unit can be a positive (+) common electrode wiring unit, and the second common electrode wiring unit can be a negative (−) common electrode wiring unit. Further, the first common electrode wiring unit can be a negative (−) common electrode wiring unit and the second common electrode wiring unit can be a positive (+) common electrode wiring unit.

The wire electrode unit and the light emitting device mounting unit of the transparent light emitting device display according to the exemplary embodiment of the present application are schematically illustrated in FIG. 6.

According to the exemplary embodiment of the present application, a channel is formed in a structure, in which the signal electrode wiring unit passes between the positive (+) common electrode wiring unit and the negative (−) common electrode wiring unit, so that each light emitting device does not have a separate electrode wire, and can be connected to the positive (+) common electrode wiring unit and the negative (−) common electrode wiring unit as a common electrode.

The light emitting device mounting unit is a configuration provided at a position, at which the light emitting device is mounted by using solder, and two or more light emitting device mounting units can be provided on the transparent substrate, and the number of light emitting devices can be appropriately selected by those skilled in the art in consideration of a usage of the transparent light emitting device display, and is not particularly limited. More particularly, the number of light emitting devices is related to resistance of an electrode, and when an electrode has sufficiently low resistance and an area of the display is large, the number of light emitting devices can be increased. When the number of light emitting devices in the same area is increased, resolution becomes high, and when the number of light emitting devices is increased with the same interval, an area of the display can be increased and electric lines of a power supply unit can be decreased, so that the number of light emitting devices can be appropriately selected by those skilled in the art in consideration of a usage of the transparent light emitting device display.

In the exemplary embodiment of the present application, the two or more light emitting devices can be serially connected with the signal electrode wiring unit, and can be serially connected with the first common electrode wiring unit and the second common electrode wiring unit. The first common electrode wiring unit and the second common electrode wiring unit provide the amount of current enough to drive the light emitting devices, and a color signal of the light emitting device can be transmitted only with a low current, so that the first common electrode wiring unit and the second common electrode wiring unit can be serially connected with the signal electrode wiring unit. When all of the light emitting devices are connected with the power supply unit through the electrodes thereof, respectively, in parallel, not in the structure of the present application, for the driving and the transmission of the signals of all of the light emitting devices, it is necessary to vary each electrode width in order to meet a resistance value according to a disposition distance of the light emitting device (a width of the electrode connected to the farthest light emitting device is largest), and it is difficult to configure an electrode of low resistance due to a spatial limit in an electrode disposition region according to the characteristic in that the plurality of light emitting devices is provided.

The light emitting device mounting unit can comprise gold, silver, aluminum, copper, neodymium, molybdenum, nickel, or an alloy thereof, but is not limited thereto.

In the present application, the light emitting device mounting unit is a configuration provided at the position, at which the light emitting device is mounted by using solder, and each light emitting device mounting unit can comprise at least four electrode pad units electrically connected with the first common electrode wiring unit, the second common electrode wiring unit, and the signal electrode wiring unit. At least four electrode pad units can comprise two signal electrode pad units, one first common electrode pad unit, and one second common electrode pad unit. The two signal electrode pad units are signal in-out pad units of the light emitting devices and can be provided at distal ends of the signal electrode wiring units, respectively, and the first common electrode pad unit and the second common electrode pad unit can be provided at distal ends of the first common electrode wiring unit and the second common electrode wiring unit, respectively.

Further, at least one capacitor pad unit can be additionally provided on the transparent substrate. In the exemplary embodiment of the present application, the number of capacitor pad units can be two. The capacitor pad unit is a pad, to which a capacitor is attached, and the capacitor can serve to stabilize a current supplied to the light emitting device.

Each of at least four electrode pad units may not comprise the metal mesh pattern, and an entire region of each pad unit can be formed of metal. More particularly, the electrode pad unit is a portion hidden by a welded light emitting device, so that the electrode pad unit may not comprise the metal mesh pattern, and an entire region of each pad unit can be formed of metal.

A gap between at least four electrode pad units can be 0.1 mm to 1 mm. By forming the gap, it is possible to prevent a short-circuit phenomenon in consideration of clearance when a solder paste is screen-printed for forming the light emitting device later.

The forms of the electrode pad unit and the capacitor pad unit are not particularly limited, and can be quadrangles. Further, each size of the electrode pad unit and the capacitor pad unit can be 0.1 $mm^2$ to 1 $mm^2$, but is not limited thereto.

The four electrode pad units can be bonded to one light emitting device. That is, in the exemplary embodiment of the present application, when the plurality of light emitting devices is provided on the transparent substrate, each of the light emitting devices can be bonded to the four electrode pad units.

In the exemplary embodiment of the present application, the first common electrode wiring unit, the second common electrode wiring unit, and the signal electrode wiring unit can comprise the metal mesh patterns having the same line width, line height, and pitch. In the present application, the same line width of the metal mesh pattern means that a standard deviation of a line width is 20% or less, preferably, 10% or less, and more preferably, 5% or less. Further, in the present application, the same line height of the metal mesh pattern means that a standard deviation of a line height is 10% or less, preferably, 5% or less, and more preferably, 2% or less. Further, in the present application, the same line pitch of the metal mesh pattern means that a standard deviation of pitch is 10% or less, preferably, 5% or less, and more preferably, 2% or less.

In the exemplary embodiment of the present application, the metal mesh pattern can be provided in the entire region of the effective screen unit on the transparent substrate, except for the region, in which the light emitting devices are provided. More particularly, the metal mesh pattern can be provided in a region having an area of 80% or more of the entire area of the upper surface of the transparent substrate, and can be provided in a region having an area of 99.5% or less. Further, the metal mesh pattern can be provided in a region having an area of 80% or more of an area, in which a flexible printed circuit board (FPCB) pad unit region and a light emitting device pad unit region provided on the transparent substrate are excluded, based on the entire area of the upper surface of the transparent substrate, and can be provided in a region having an area of 99.5% or less. In the present application, the FPCB pad unit region comprises an FPCB pad unit applying external power, and an area of the FPCB pad unit region can be equal to or larger than an entire area of an FPCB pad unit, and be equal to or smaller than three times the entire area of the FPCB pad unit. Further, in the present application, the light emitting device pad unit region can comprise the electrode pad unit, and an area of the light emitting device pad unit region can be equal to or larger than 1.5 times an entire area of the electrode pad unit, and be equal to or smaller than three times the entire area of the electrode pad unit.

In the present application, the pattern form in the art can be used as the metal mesh pattern of the wire electrode unit. More particularly, the metal mesh pattern can comprise a polygonal pattern comprising one or more forms among a triangle, a quadrangle, a pentagon, a hexagon, and an octagon.

The metal mesh pattern can comprise a straight line, a curve, or a closed curve formed of a straight line or a curve.

The metal mesh pattern can be provided in the entire region of the effective screen unit of the upper surface of the transparent substrate, except for the region, in which the light emitting device mounting units are provided, so that it is possible to secure a maximally allowable wiring region, thereby improving a resistance characteristic of the transparent light emitting device display. More particularly, surface resistance of the metal mesh pattern can be equal to or smaller than 0.1 Ω/sq.

Pitch of the metal mesh pattern can be 100 μm to 1,000 μm, can be 100 μm to 600 μm, and 100 μm to 300 μm, but can be adjusted by those skilled in the art based on desired transmittance and conductivity.

A material of the metal mesh pattern is not particularly limited, but can comprise one or more of metal and a metal alloy. The metal mesh pattern can comprise gold, silver, aluminum, copper, neodymium, molybdenum, nickel, or an alloy thereof, but is not limited thereto.

A line height of the metal mesh pattern is not particularly limited, but can be 3 μm or more in an aspect of conductivity of the metal mesh pattern and economic feasibility of a process of forming the metal mesh pattern, and can be 3 μm to 10 μm.

A line width of the metal mesh pattern can be 25 μm or less, and can be 20 μm or less, but is not limited thereto. The smaller line width of the metal mesh pattern can be advantageous in an aspect of transmissivity and wire visibility, but can cause a decrease in resistance, and in this case, when the line height of the metal mesh pattern is high, it is possible to improve the decrease in resistance. The line width of the metal mesh pattern can be 5 μm or more.

An aperture ratio of the metal mesh pattern, that is, a ratio of an area, which is not covered by the pattern, can be 70% or more, 85% or more, and 95% or more.

According to the exemplary embodiment of the present application, the metal mesh pattern having the same line width, line height, and pitch is applied to the first common electrode wiring unit, the second common electrode wiring unit, and the signal electrode wiring unit, thereby decreasing visibility of the wire. When the line widths, the pitches, or the line heights of the metal mesh patterns of the first common electrode wiring unit, the second common electrode wiring unit, and the signal electrode wiring unit are not the same, visibility of the wire electrode unit can increase, so that the case is not preferable.

In the present application, the metal mesh patterns of the first common electrode wiring unit, the second common electrode wiring unit, and the signal electrode wiring unit can be separated from each other by a disconnection portion. The disconnection portion means a region, in which a part of the metal mesh pattern is disconnected to cut an electric connection. A width of the disconnection portion can mean a distance between the most adjacent distal ends among the first common electrode wiring unit, the second common electrode wiring unit, and the signal electrode wiring unit, which are spaced apart from one another. A width of the disconnection portion can be 80 μm or less, can be 60 μm or less, can be 40 μm or less, and can be 30 μm or less, but is not limited thereto. The width of the disconnection portion can be 5 μm or more.

Further, a line width 140, a line height 150, and pitch 160 of the metal mesh pattern according to the exemplary embodiment of the present application are schematically illustrated in FIG. 7. A line width, a line height, and pitch of the metal mesh pattern can be measured by using a method well known in the art. For example, the method can comprise a method of observing and measuring a scanning electron microscope (SEM) cross-section, a measurement method using a contactless surface shape measuring device (optical profiler), a measurement method using a stylus surface step measuring device (alpha step or surface profiler), and the like.

According to the exemplary embodiment of the present application, it is possible to decrease visibility of the wire by minimizing a width of the disconnection portion, which separates the metal mesh patterns of the first common electrode wiring unit, the second common electrode wiring unit, and the signal electrode wiring unit.

In the present application, each of the metal mesh patterns of the first common electrode wiring unit, the second common electrode wiring unit, and the signal electrode wiring unit can also be formed by an independent printing process, and can also be formed by one printing process at the same time. Accordingly, the metal mesh patterns of the first common electrode wiring unit, the second common electrode wiring unit, and the signal electrode wiring unit can have the same line height. In the present application, the same line height means that a standard deviation of a line height is less than 10%, preferably, less than 5%, or more preferably, less than 2%.

In the present application, in the exemplary embodiment of the present application, the printing method is used for forming the metal mesh patterns of the first common electrode wiring unit, the second common electrode wiring unit, and the signal electrode wiring unit, so that it is possible to form the metal mesh patterns of the first common electrode wiring unit, the second common electrode wiring unit, and the signal electrode wiring unit, which have the small line widths and are precise, on the transparent substrate. The printing method is not particularly limited, and off-set printing, screen printing, gravure printing, flexographic printing, inkjet printing, nano-imprint, and the like can be used as the printing method, and a complex method comprising one or more of offset printing, screen printing, gravure printing, flexographic printing, inkjet printing, and nano-imprint can also be used. The printing method can use a roll to roll method, a roll to plate method, a plate to roll method, or a plate to plate method.

In the present application, in order to implement the precise metal mesh pattern, a reverse offset printing method can be applied. To this end, in the present application, there can be performed a method, in which an upper portion of silicon-based rubber, which is called a blanket, is entirely coated with ink, which can serve as resist during etching, an unnecessary portion is firstly removed from the blanket through an intaglio, in which a pattern called a cliché is carved, a printing pattern left on the blanket is secondarily transferred to a base material, such as a film or glass, on which metal and the like is deposited, and then a desired pattern is formed through plasticizing and etching processes. When the method is used, the base material, on which metal is deposited, is used, so that uniformity of a line height is secured in the entire region and thus there is an advantage in that it is possible to uniformly maintain resistance in a thickness direction. In addition, the present application can comprise the direct printing method, in which conductive ink is directly printed by using the reverse offset printing method and then is plasticized to form a desired pattern. In this case, the line height of the pattern can be flattened by pressing impression pressure, and conductivity can be given by a thermoplastic process or microwave plasticizing process, a laser partial plasticizing process, and the like, which are the purpose of connecting metal nano particles by mutual surface welding.

The electrode substrate for the transparent light emitting device display according to an exemplary embodiment of the present application is schematically illustrated in FIG. 1. As illustrated in FIG. 1, the electrode substrate for a transparent light emitting device display according to the exemplary embodiment of the present application comprises: a transparent substrate 10; a wire electrode unit 20, which is provided on the transparent substrate 10 and comprises a metal mesh pattern; and at least one light emitting device mounting unit 30 provided on the transparent substrate 10, in which both an upper surface and a lateral surface of the metal mesh pattern of the wire electrode unit 20 comprise a darkening layer pattern 40, and both an upper surface and a lateral surface of the light emitting device mounting unit 30 do not comprise the darkening layer pattern.

A method of manufacturing an electrode substrate for a transparent light emitting device display according to an exemplary embodiment of the present application comprises: preparing an electrode substrate comprising a transparent substrate, a wire electrode unit, which is provided on the transparent substrate and comprises a metal mesh pattern, and at least one light emitting device mounting unit provided on the transparent substrate; forming a resist pattern on both an upper surface and a lateral surface of at least one light emitting device mounting unit; forming a darkening layer pattern on both an upper surface and a lateral surface of the metal mesh pattern of the wire electrode unit; and removing the resist pattern.

In the present application, the forming of the resist pattern can use a method known in the art, and more particularly, the forming of the resist pattern can be performed by a photolithography method, an inkjet printing method, or a screen printing method, but is not limited thereto.

The resist pattern can comprise one or more of a cresol novolac resin, a phenol novolac resin, an epoxy phenol novolac resin, and a polyhydroxy styrene resin, but is not limited thereto.

In the present application, the forming of the darkening layer pattern can be performed by a plating process using a plating solution comprising one or more of copper, selenium, cobalt, nickel, manganese, magnesium, sodium, an oxide thereof, and a hydroxide thereof. The plating process can be an electroplating process, an electroless plating process, and the like.

The method of manufacturing an electrode substrate for the transparent light emitting device display according to the exemplary embodiment of the present application is schematically illustrated in FIGS. 2A-2D.

Further, an exemplary embodiment of the present application provides a transparent light emitting device display comprising the electrode substrate for the transparent light emitting device display.

The transparent light emitting device display can have a structure, in which solder is provided on the light emitting device mounting unit of the electrode substrate for the transparent light emitting device display, and the light emitting device is provided on the solder. A method of manufacturing the transparent light emitting device display can use a method known in the art, except for using the electrode substrate for the transparent light emitting device display according to the present application.

MODE FOR CARRYING OUT THE INVENTION

Hereinafter, the exemplary embodiments described in the present specification will be exemplified through Examples. However, this does not intend to limit the range of the exemplary embodiments by the Examples.

EXAMPLE

Comparative Example 1

Copper was deposited with a thickness of 8 µm on a PET film having a thickness of 250 µm through an electroplating process. A resist pattern was formed on the deposited base material through a reverse offset printing process. Copper in a region, in which the resist pattern is not provided, was removed by using a ferric chloride-based copper etchant having a concentration of 10% and spray etching equipment. The remaining resist pattern was removed by using an aqueous solution of 1 wt % of NaOH to manufacture an electrode substrate.

Figure 4A:
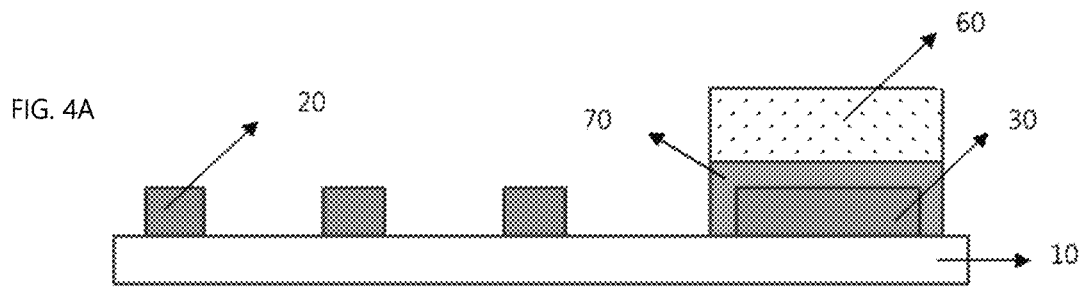
FIG. 4A is a diagram schematically illustrating a structure.
Figure 4B:
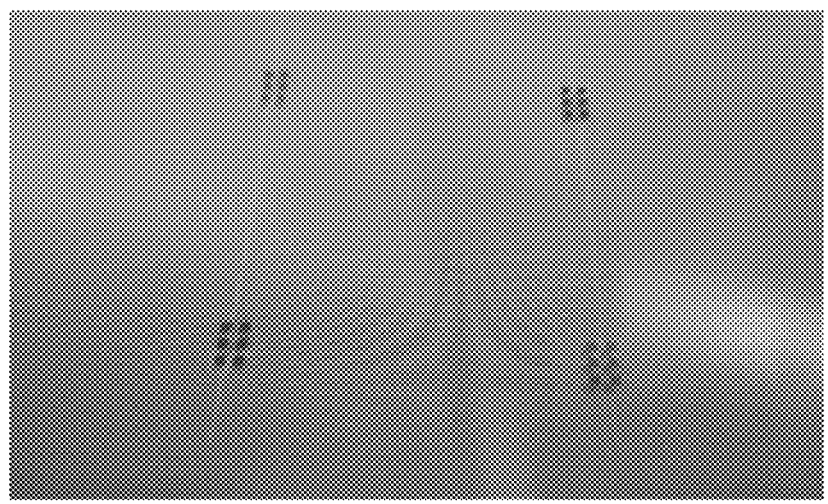
FIG. 4B is a camera image.
Figure 4C:
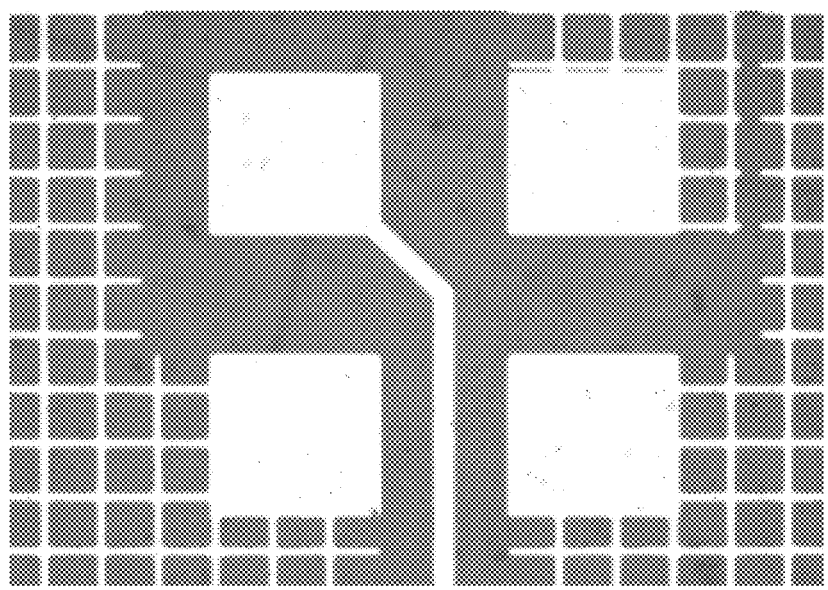
FIG. 4C is a microscope image of a transparent light emitting device display according to Comparative Example 1 of the present application.

A structure, a camera image, and a microscope image of a transparent light emitting device display according to Comparative Example 1 is schematically illustrated in FIGS. 4A, 4B and 4C, respectively.

Comparative Example 2

The electrode substrate of Comparative Example 1 was immersed in a solution, in which YBM-100 that is a copper darkening processing agent of YMT Company was diluted in ultrapure water at a concentration of 10% at a room temperature for 30 seconds, and then washing and drying processes were performed. Accordingly, the electrode substrate, in which a front surface darkening process is completed, was manufactured.

Figure 5A:
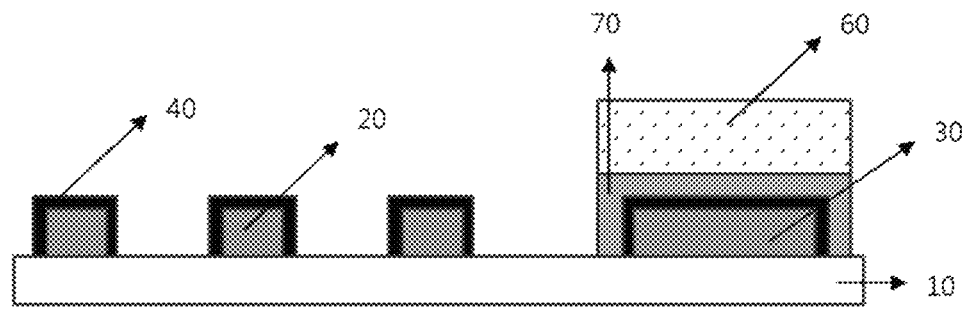
FIG. 5A is a diagram schematically illustrating a structure.
Figure 5B:
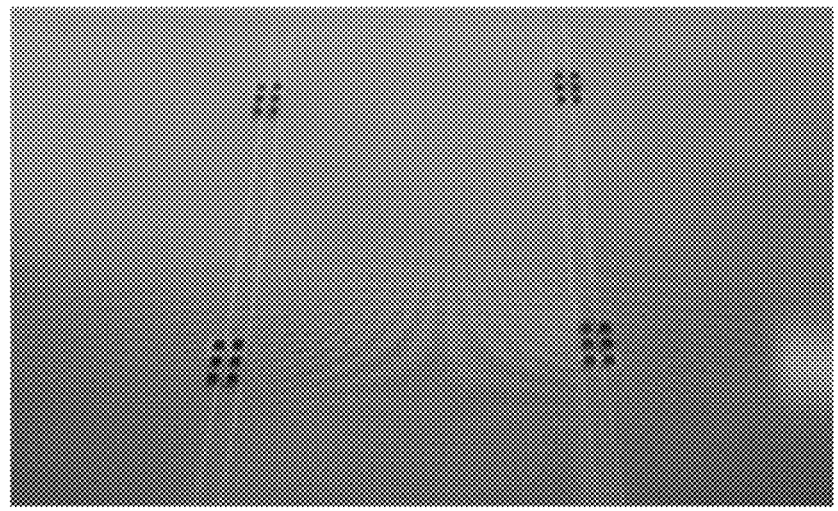
FIG. 5B is a camera image.
Figure 5C:
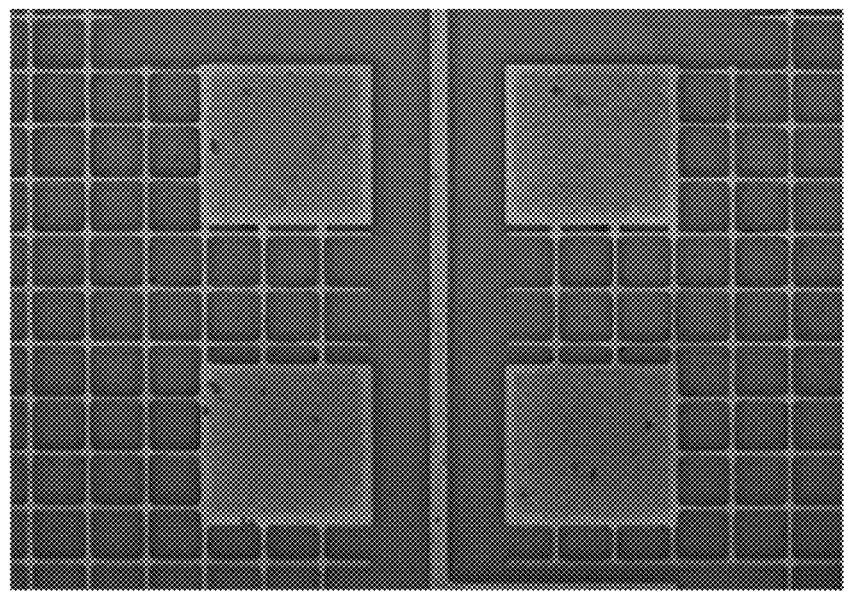
FIG. 5C is a microscope image of a transparent light emitting device display according to Comparative Example 2 of the present application.

A structure, a camera image, and a microscope image of a transparent light emitting device display according to Comparative Example 2 is schematically illustrated in FIGS. 5A, 5B and 5C, respectively.

Example 1

Resist paste was selectively printed on the light emitting device mounting unit by using a screen printing method on the electrode substrate of Comparative Example 1. The resist for the screen printing was prepared by dissolving a cresol novolac resin of 40 g, of which weight average molecular weight is 10,000 g/mol, and Glide-410 that is a surfactant by Tego Company of 0.1 g in PGMEA of 59.9 g.

The electrode substrate provided with the resist pattern was immersed in a solution, in which YBM-100 that is a copper darkening processing agent by YMT Company was diluted in ultrapure water at a concentration of 10% at a room temperature for 30 seconds, and then washing and drying processes were performed to complete the darkening process.

The remaining resist pattern was removed by immersing the electrode substrate, in which the darkening process was completed, in an aqueous solution of 1 wt % of NaOH for 30 seconds, and then washing and drying processes were performed to manufacture the electrode substrate, in which the selective darkening process was completed.

Figure 3A:
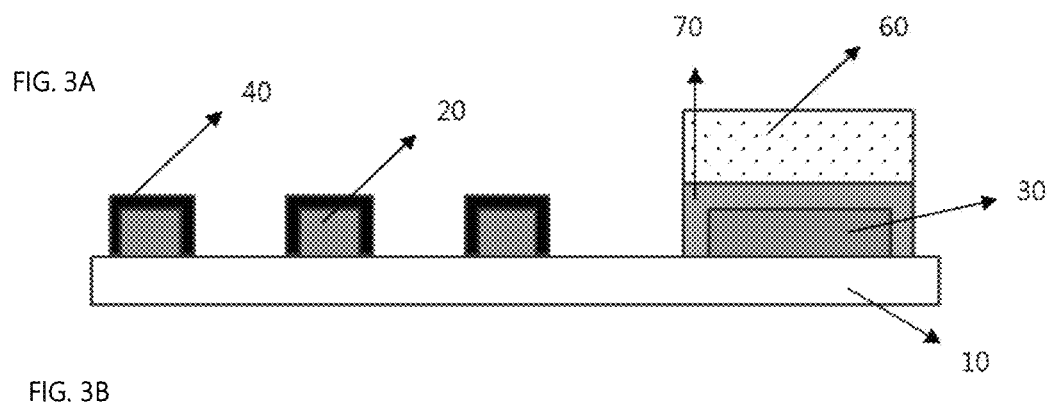
FIG. 3A is a diagram schematically illustrating a structure.
Figure 3B:
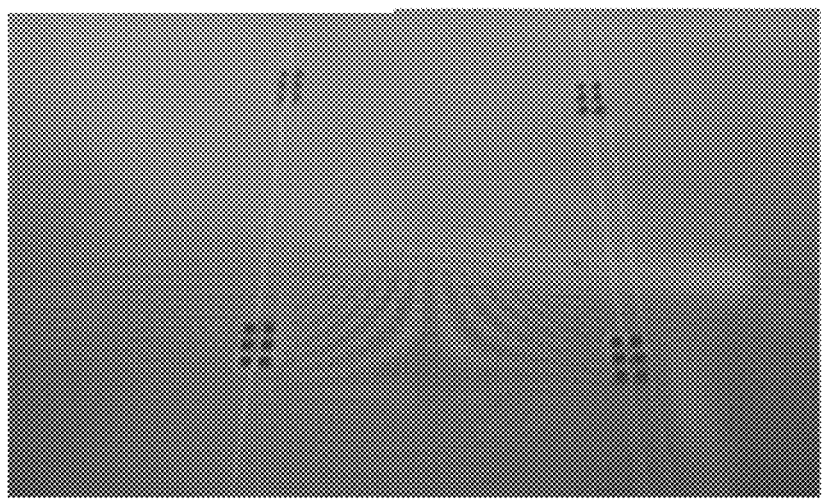
FIG. 3B is a camera image.
Figure 3C:
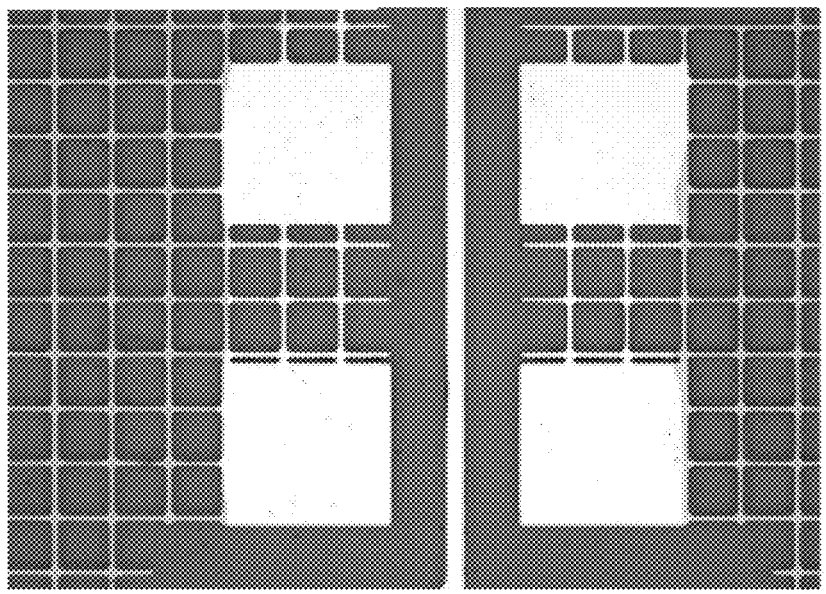
FIG. 3C is a microscope image of a transparent light emitting device display according to Example 1 of the present application.

A structure, a camera image, and a microscope image of a transparent light emitting device display according to Example 1 is schematically illustrated in FIGS. 3A, 3B and 3C, respectively.

Experimental Example

An evaluation result of the characteristics of the electrode substrates of Example 1 and Comparative Examples 1 and 2 is represented in Table 1 below.

Figure 8A:
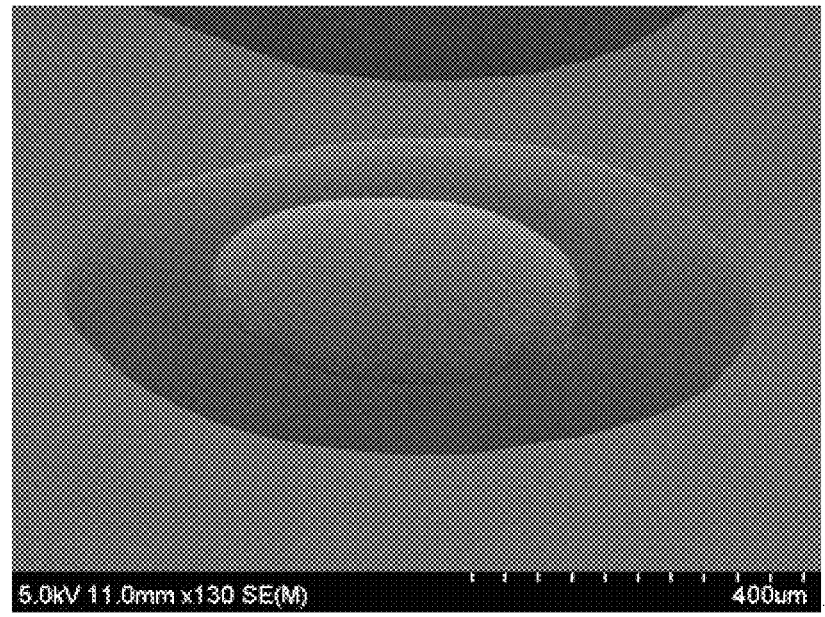
FIG. 8A is a diagram illustrating a picture of a shape of solder after a heat treatment and FIG. 8B is a picture after an attachment evaluation of Example 1 of the present application.
Figure 8B:
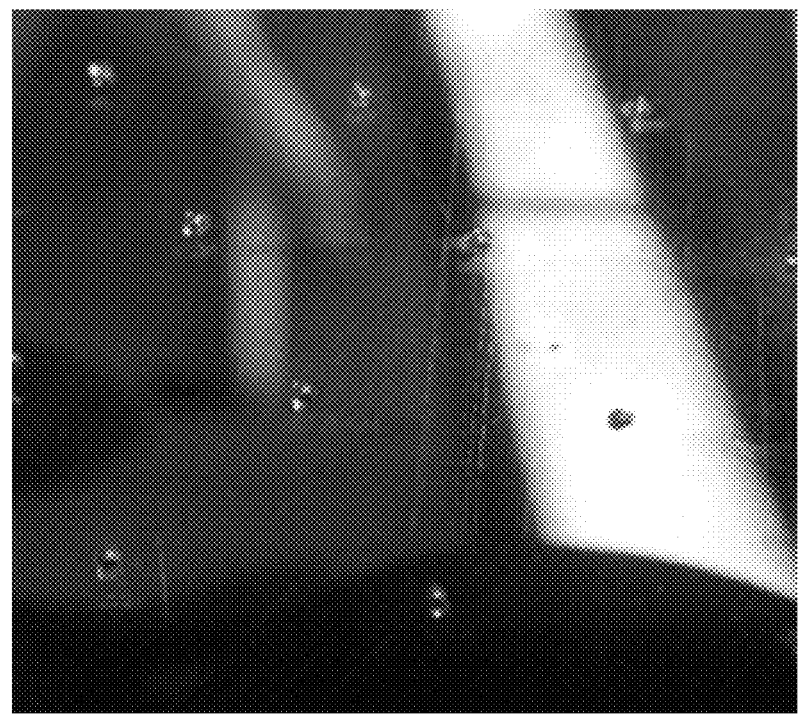
Figure 9A:
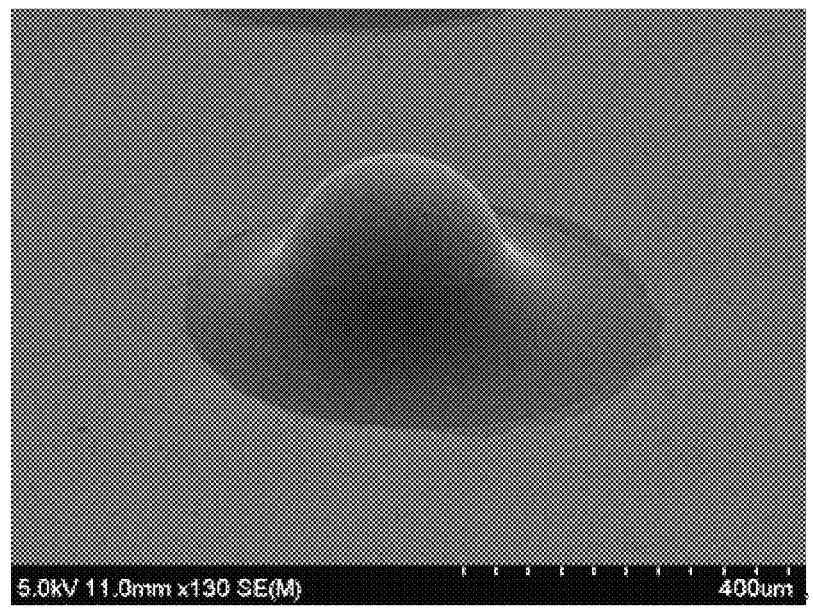
FIG. 9A is a diagram illustrating a picture of a shape of solder after a heat treatment and FIG. 9B is a picture after an attachment evaluation of Comparative Example 2 of the present application.
Figure 9B:
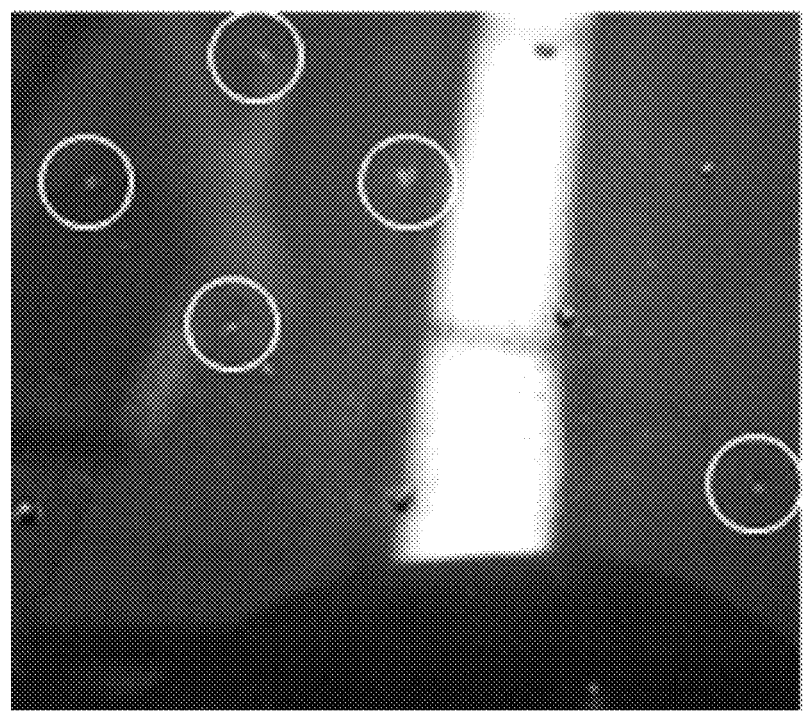

Solder attachment force of the light emitting device mounting unit pattern was evaluated by a method described below. A solder paste pattern was formed on the light emitting device mounting unit pattern by using screen printing, and the electrode substrate was heat treated at 150° C. for five minutes. Then, the number of solder paste patterns detached from the light emitting device mounting unit pattern was measured through a 3M magic tape test. The case where the number of detached patterns is 0 based on a total of 20 solder paste patterns was evaluated as "OK", and the case where the number of detached patterns is three or more based on a total of 20 solder paste patterns was evaluated as "NG". A picture of a shape of the solder after the heat treatment and a picture after the attachment evaluation of Example 1 are presented in FIGS. 8A and 8B, respectively, and a picture of a shape of the solder after the heat treatment and a picture after the attachment evaluation of Comparative Example 2 are presented in FIGS. 9A and 9B, respectively. As can be seen from the results of FIGS. 9A and 9B, it can be seen that the solder is separated after the attachment evaluation in Comparative Example 2.

Reflectance and a yellow index were measured by using a spectrophotometer (solidspec-3700, Shimadzu Corp.).

TABLE 1

|  | Example 1 | Comparative Example 1 | Comparative Example 2 |
|---|---|---|---|
| Solder attachment force of light emitting device mounting unit pattern | OK | OK | NG |
| Reflectance (@ 400 nm) of wire electrode unit pattern | 10.71 | 11.49 | 10.67 |
| Reflectance (@ 600 nm) of wire electrode unit pattern | 11.41 | 23.41 | 11.38 |
| Reflectance (@ 780 nm) of wire electrode unit pattern | 8.27 | 24.98 | 8.32 |
| Yellow index of wire electrode unit pattern | 0.81 | 44.32 | 0.77 |

As can be seen in the results, according to the exemplary embodiment of the present application, the darkening layer pattern is provided on both the upper surface and the lateral surface of the metal mesh pattern of the wire electrode unit, so that there is a characteristic in that it is possible to decrease visibility of the electrode substrate for the transparent light emitting device display.

Further, the darkening layer pattern is provided on both the upper surface and the lateral surface only of the metal mesh pattern of the wire electrode unit, but is not provided on the upper surface and the lateral surface of the light emitting device mounting unit, so that there is an effect in that attachment force of the solder provided on the light emitting device mounting unit is maintained during the manufacturing of the transparent light emitting device display.

Further, according to the exemplary embodiment of the present application, the metal mesh pattern having the same line width, line height, and pitch is applied to the first common electrode wiring unit, the second common electrode wiring unit, and the signal electrode wiring unit, thereby decreasing visibility of the wire. Further, the metal mesh pattern of the wire electrode unit is provided in the entire region of the effective screen unit of the upper surface of the transparent substrate, except for the light emitting device mounting unit pattern, so that it is possible to maximize an extent of the common electrode wiring unit and reduce resistance.

The invention claimed is:

1. An electrode substrate for a transparent light emitting device display, the electrode substrate comprising:
   a transparent substrate;
   a wire electrode unit, which is provided on the transparent substrate and comprises a metal mesh pattern; and
   at least one light emitting device mounting unit provided on the transparent substrate,
   wherein both an upper surface and a lateral surface of the metal mesh pattern of the wire electrode unit comprise a darkening layer pattern comprising one or more materials selected from among an oxide or hydroxide of: copper, selenium, cobalt, nickel, manganese, and magnesium, and
   both an upper surface and a lateral surface of the light emitting device mounting unit do not comprise a darkening layer pattern.

2. The electrode substrate of claim 1, wherein the wire electrode unit comprises a first common electrode wiring unit, a second common electrode wiring unit, and a signal electrode wiring unit.

3. The electrode substrate of claim 2, wherein the first common electrode wiring unit, the second common electrode wiring unit, and the signal electrode wiring unit comprise metal mesh patterns having the same line width, line height, and pitch, and the metal mesh pattern is provided in an entire region of an effective screen unit on a transparent substrate, except for the light emitting device mounting unit.

4. The electrode substrate of claim 1, wherein a line width of the metal mesh pattern is 25 μm or less, pitch of the metal mesh pattern is 100 μm to 1,000 μm, and a line height of the metal mesh pattern is 3 μm or more.

5. The electrode substrate of claim 2, wherein the metal mesh patterns of the first common electrode wiring unit, the second common electrode wiring unit, and the signal electrode wiring unit are separated from one another by a disconnection portion, and a width of the disconnection portion is 80 μm or less.

6. The electrode substrate of claim 1, wherein each of the wire electrode unit and the light emitting device mounting unit independently comprises gold, silver, aluminum, copper, neodymium, molybdenum, nickel, or an alloy thereof.

7. The electrode substrate of claim 2, wherein the light emitting device mounting unit comprises at least four electrode pad units, which are electrically connected with the first common electrode wiring unit, the second common electrode wiring unit, and the signal electrode wiring unit.

8. The electrode substrate of claim 7, wherein the at least four electrode pad units comprise two signal electrode pad units, one first common electrode pad unit, and one second common electrode pad unit.

9. A method of manufacturing an electrode substrate for a transparent light emitting device display, the method comprising:

preparing an electrode substrate comprising a transparent substrate, a wire electrode unit, which is provided on the transparent substrate and comprises a metal mesh pattern, and at least one light emitting device mounting unit provided on the transparent substrate;

forming a resist pattern on both an upper surface and a lateral surface of at least one light emitting device mounting unit;

forming a darkening layer pattern comprising one or more materials selected from among an oxide or hydroxide of: copper, selenium, cobalt, nickel, manganese, and magnesium on both an upper surface and a lateral surface of the metal mesh pattern of the wire electrode unit; and removing the resist pattern.

10. The method of claim 9, wherein the forming of the resist pattern is performed by a photolithography method, an inkjet printing method, or a screen printing method.

11. The method of claim 9, wherein the resist pattern comprises one or more of a cresol novolac resin, a phenol novolac resin, an epoxy phenol novolac resin, and a polyhydroxy styrene resin.

12. The method of claim 9, wherein the forming of the darkening layer pattern is performed by a plating process using a plating solution comprising one or more of copper, selenium, cobalt, nickel, manganese, magnesium, sodium, an oxide thereof, and a hydroxide thereof.

13. A transparent light emitting device display comprising the electrode substrate for the transparent light emitting device display of claim 1.

* * * * *